US 6,652,663 B2

(12) United States Patent
Ryu

(10) Patent No.: US 6,652,663 B2
(45) Date of Patent: Nov. 25, 2003

(54) COMPOSITION FOR ELIMINATING THERMOSETTING RESIN

(75) Inventor: Ki Hyun Ryu, Kumi-shi (KR)

(73) Assignee: LG. Philips LCD Co., Ltd., Seoul (KR)

( * ) Notice: Subject to any disclaimer, the term of this patent is extended or adjusted under 35 U.S.C. 154(b) by 123 days.

(21) Appl. No.: 09/765,672

(22) Filed: Jan. 22, 2001

(65) Prior Publication Data
US 2001/0035519 A1 Nov. 1, 2001

(30) Foreign Application Priority Data
Jan. 22, 2000 (KR) ........................................ P2000-3127

(51) Int. Cl.$^7$ ................................................. B08B 3/00
(52) U.S. Cl. ............................. 134/26; 134/29; 134/38; 134/42; 134/902; 510/175; 510/201; 252/79.1; 252/79.4
(58) Field of Search ................................ 510/175, 201; 134/38, 42, 26, 29, 902; 252/79.4, 79.1

(56) References Cited
U.S. PATENT DOCUMENTS

| 5,185,235 A | * | 2/1993 | Sato et al. ..................... 134/40 |
| 5,292,445 A | * | 3/1994 | Fjare et al. ..................... 216/83 |
| 5,795,702 A | * | 8/1998 | Tanabe et al. ............... 430/256 |
| 6,017,862 A | * | 1/2000 | Doyel et al. ................. 510/163 |
| 6,060,439 A | * | 5/2000 | Doyel et al. ................. 510/164 |
| 6,277,799 B1 | * | 8/2001 | Sachdev et al. ................. 134/2 |
| 6,280,527 B1 | * | 8/2001 | Sachdev et al. ................. 134/2 |
| 6,351,871 B1 | * | 3/2002 | Sachdev et al. ......... 134/103.1 |

FOREIGN PATENT DOCUMENTS

KR    10-0254292    2/2000

* cited by examiner

Primary Examiner—Randy Gulakowski
Assistant Examiner—M. Kornakov
(74) Attorney, Agent, or Firm—Birch, Stewart, Kolasch & Birch, LLP

(57) ABSTRACT

A composition suitable for eliminating a thermosetting resin (and a method of so using the composition) is disclosed. In the composition, tetra methyl ammonium hydroxide (TMAH) is included so as to eliminate the thermosetting resin. Accordingly, the composition is suitable for removing a dielectric layer, an organic protective layer, an insulating layer, an alignment layer, black matrices and color filters, etc. made form a thermosetting resin in an LCD or a semiconductor, and permits a reproduction or a rework of the thermosetting resin film.

13 Claims, 5 Drawing Sheets

COMPOSITION FOR ELIMINATING THERMOSETTING RESIN

BACKGROUND OF THE INVENTION

1. Field of the Invention

This invention relates to a composition suitable for eliminating a thermosetting resin, and a thermosetting resin eliminating apparatus using the same.

2. Description of the Related Art

Generally, an active matrix liquid crystal display (LCD) uses a thin film transistor (TFT) as a switching device to display a moving picture. Since the LCD is able to provide a product having a smaller dimension than a Cathode Ray tube, it has been widely used in various applications including personal computer, notebook computer, office automation equipment such as a copy machine, etc., and portable equipment such as a PDA and a pager, etc.

Such an LCD typically uses a thermosetting resin such as polyimide, polyacrylate or benzocyclobutane, etc. as a material of a dielectric layer, an organic protective layer, an insulating layer, an alignment film, a black matrix and a color filter. However, this film or layer formation using said thermosetting resin raises a problem of a difficult stripping process. Thus, if a problem occurs with a film or layer made from a thermosetting resin in a process of manufacturing an LCD or a semiconductor, then the film or layer has been often discarded because of a difficulty of rework or reproduction. In order to prevent such a loss, a rework process for each process has been developed.

FIG. 1 and FIG. 2 shows a method of forming color filters step by step. Referring to FIG. 2, at step S1, Cr/CrO$_X$ or Cr/CrN$_X$/CrO$_X$ is entirely deposited on a bare glass substrate 2 and thereafter patterned. Then, black matrices 4 are formed on the bare glass substrate 2 at step S2. Alternatively, the black matrices 4 made from a resin may be formed by entirely coating polyacrylate added with a black pigment on the bare glass substrate 2 and thereafter patterning it.

As a result of testing the black matrices 4 formed in this manner, if it is judged that a problem exists with the black matrices 4, a process of reworking the black matrices 4 is carried out at step S3. Herein, since the black matrices 4 are made from a thermosetting resin and because it is impossible to completely eliminate a thermosetting resin, black matrices made from a metal only is introduced into the rework process. After the black matrices 4 are formed, red, green and blue color filters 16R, 16G and 16B are sequentially formed on the substrate 2 at steps S4 to S6.

First, as shown in FIG. 1, a red resin 6 is entirely coated on the substrate 2 and then a photo mask pattern 8 is formed thereon. Next, the red resin 6 made from polyacrylate is patterned by an exposure and development process. Subsequently, the green filter 16G and the blue filter 16B are formed in the same manner. Since the color filters are made from a thermosetting resin that cannot be eliminated completely, a rework process is almost impossible. Finally, after the color filters 16R, 16G and 16B were formed, indium tin oxide (ITO) used as a common electrode is entirely deposited thereon (step S7).

In order to eliminate a thermosetting resin, a dry etching method is generally used. For instance, the substrate on which a thermosetting resin is formed into a film is mounted in a chamber to inject O$_2$, O$_2$+Cl$_2$, CF$_4$ or SF$_6$, etc. into the chamber, thereby generating a plasma discharge. Then, a reaction between said injection gas and said thermosetting resin film occurs to entirely etch the thermosetting resin film. However, said dry etching method has various problems including imperfection in a post process such as a pattern badness and an electrical short badness, etc. Such problems are caused by an alien substance left at the surface after the thermosetting resin film was eliminated. For example, an under layer of the thermosetting resin film is damaged upon over-etching.

An alternative scheme for eliminating a thermosetting resin is a method of solving a problem of said dry etching and an ashing using an O$_2$ plasma and taking advantage of a stripper of a stripping liquid so as to obtain a dry cleaning effect. However, since the known strippers can eliminate only a thermosetting resin of a specific material, for example, an alignment film (i.e., polyimide, etc.) of an LCD, its use has been limited. Some example stripper compositions are listed in Table 1 and Table 2.

Strippers for eliminating color filters having a composition indicated by the following Tables 1 and 2 are capable of eliminating a blue resin or blue and green resins, but are incapable of eliminating a red resin. As a practical matter, it is difficult for such strippers to eliminate a blue resin. This is caused by a fact that, since coating and patterning of a resin followed by a high-temperature curing process are repeatedly carried out in a sequence of a red resin, a green resin and a blue resin are repeated in the color filter formation process, a green resin and a red resin are over-cured in comparison to a blue resin.

TABLE 1

| Composition of stripper A | |
| --- | --- |
| Mono Ethanol Amine | 1.97% |
| Methyl CARBITOL | 6.97% |
| Benzyl Alcohol | 10.87% |
| NMP | 11.28% |
| Diethyl CARBITOL | 11.19% |
| 1,3-Dimethyl-2-imidazolidone | 12.32% |
| Water | 45.4% |

TABLE 2

| Composition of stripper B | |
| --- | --- |
| Methanol | 2.07% |
| Mono Ethanol Amine | 6.54% |
| 2-Ethylhexanol | 32.09% |
| Water | 59.3% |

SUMMARY OF THE INVENTION

Accordingly, it is an object of the present invention to provide a composition suitable for eliminating a thermosetting resin.

Another object of the present invention is to provide an apparatus suitable for eliminating a thermosetting resin on a substrate using the composition.

In order to achieve these and other objects of the invention, there is (in part) provided a composition for eliminating a thermosetting resin (and a method of so using the composition), the composition comprising: tetra methyl ammonium hydroxide (TMAH); water; and a hygroscopic resin solvent. The hygroscopic resin solvent can be CARBITOL. A component ratio of the composition can be TMAH in a range of about 7–10 wt % and CARBITOL at about 50 wt %. Also, water can be present in a range of about 43–40 wt %, respectively, relative to said TMAH. As a more specific component ratio, TMAH can be in a range of about 7–8 wt % and water in a range of about 43–42 wt %, respectively, relative to said TMAH; or TMAH can be about 10 wt % and water about 40 wt % relative to said TMAH. The water can be de-ionized water.

The invention, in part, also provides a thermosetting resin eliminating apparatus includes: a unit to strip a substrate with any one of an dielectric layer, an organic protective film, an insulating layer, an alignment film, a black matrix and a color filter which are made from a thermosetting resin, the substrate being dipped into a composition such as described above; and a unit to mechanically clean the stripped substrate using water, preferably de-ionized water.

Advantages of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus do not limit the present invention.

DETAILED DESCRIPTION OF THE PREFERRED EMBODIMENT

A composition for eliminating a thermosetting resin according to the present invention includes tetra methyl ammonium hydroxide (TMAH), water and a hygroscopic resin solvent such as CARBITOL. An example component ratio is listed in (following) Table 3.

TABLE 3

| Substance | Component (wt %) |
|---|---|
| 20% TMAH Solution | 50 |
| CARBITOL | 50 |

In the Table 3, 20% TMAH solution means that about 20 wt % TMAH is added to de-ionized water. In other words, an example component ratio for the thermosetting-resin-eliminating composition according to the invention is a mixture including TMAH and CARBITOL having the particular formulation of about 10 wt % TMAH, about 40 wt % water and about 50 wt % CARBITOL in consideration of water. Though a preferred component ratio is TMAH at a weight ratio of about 10 wt %, but the TMAH component can also be present in an amount as low as a weight ratio of about 7 to 8 wt %. It is noted that another name for CARBITOL is (diethylene glycol)-ethyl-ether.

Figure 1:
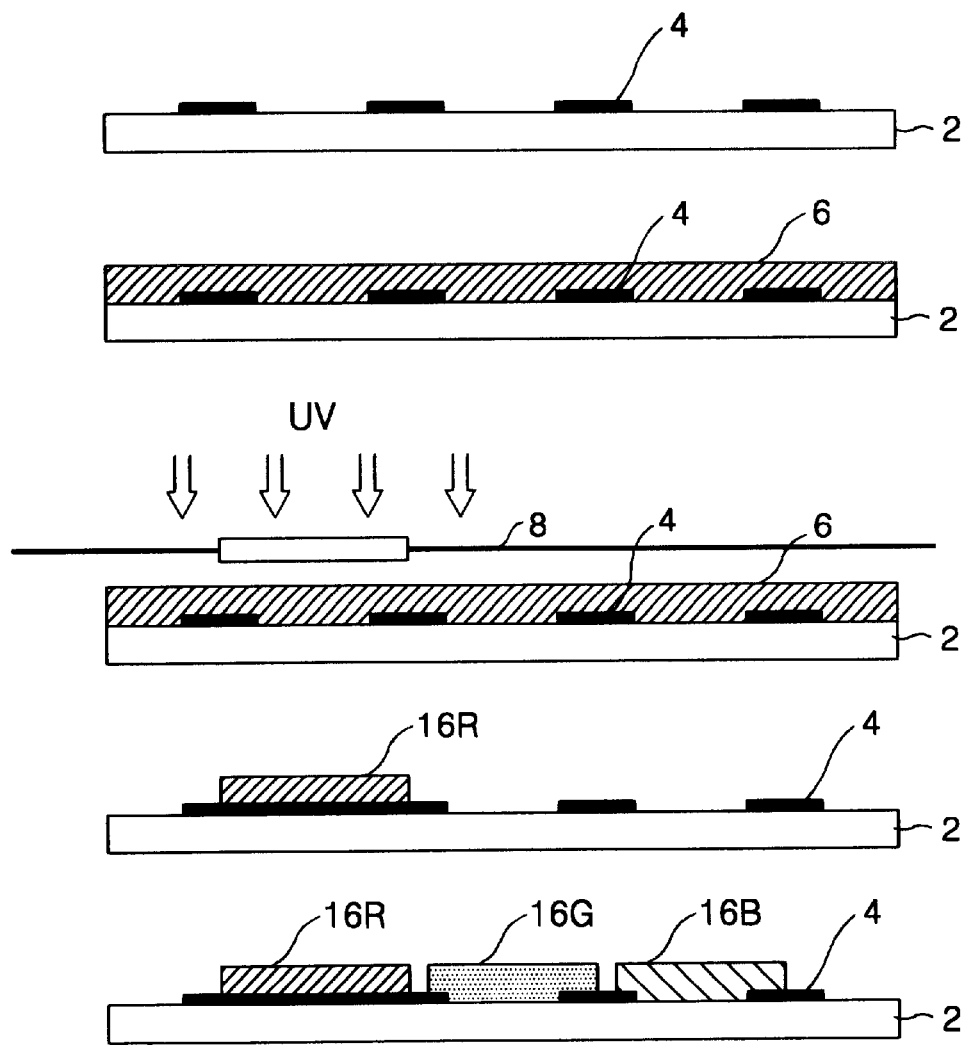
FIG. 1 is a section view showing a conventional color filter manufacturing method step by step.
Figure 2:
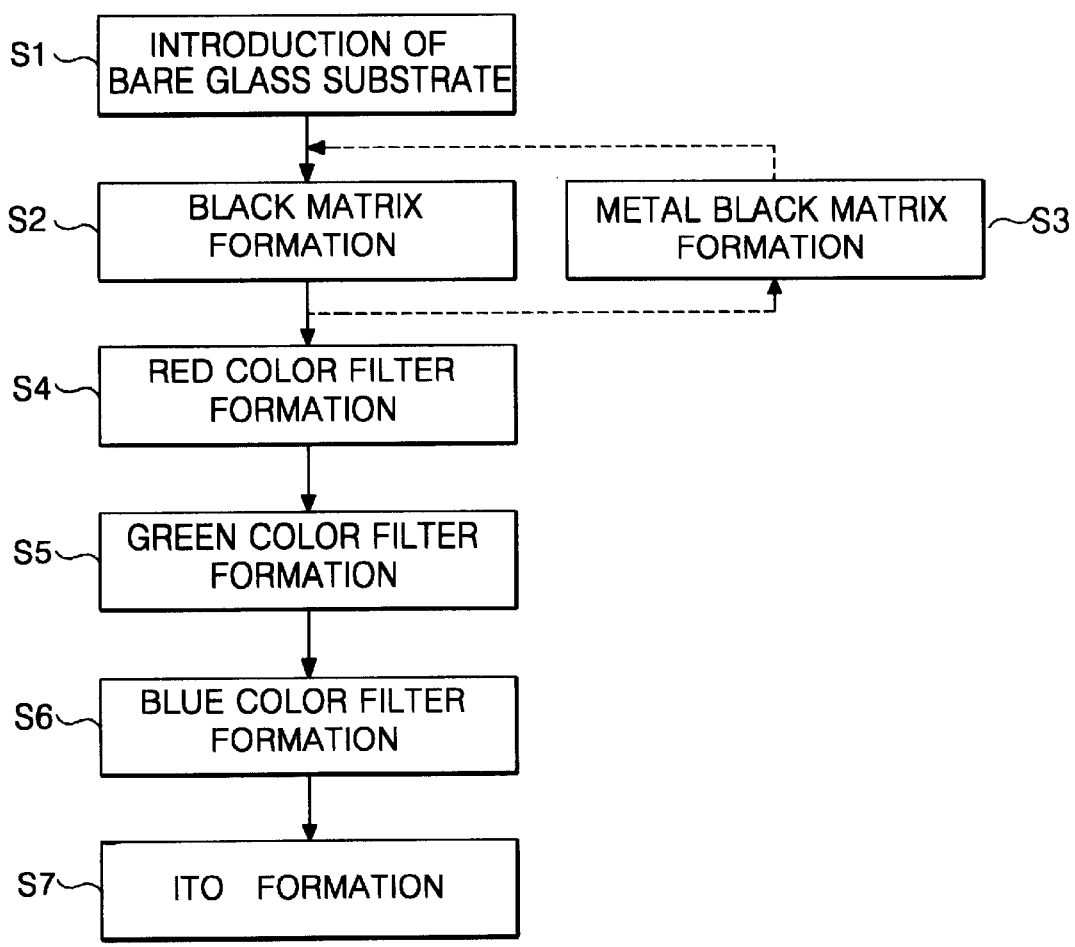
FIG. 2 is a flow chart representing a procedure of the conventional color filter manufacturing method.
Figure 3:
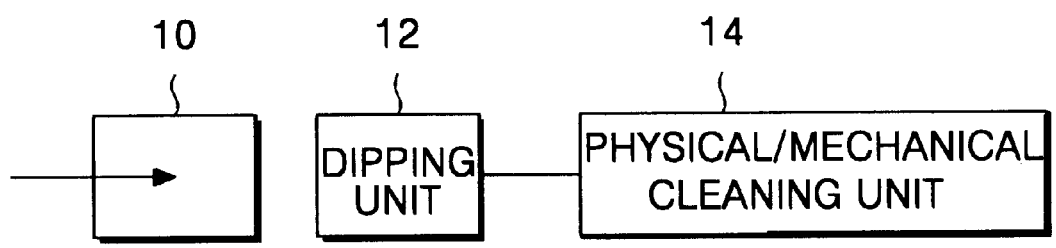
FIG. 3 is a schematic block diagram showing a configuration of a thermosetting resin removing apparatus according to an embodiment of the present invention.

FIG. 3 shows a thermosetting resin eliminating apparatus employing a composition for removing a thermosetting resin according to an embodiment of the present invention. Referring to FIG. 3, the thermosetting resin eliminating apparatus includes a dipping unit 12 connected in series, and a physical/mechanical cleaning unit 14. The dipping unit 12 includes a vessel or tub containing with a composition having a component ratio as indicated by the above Table 3.

The dipping unit 12 is fed with a substrate 10 provided with a dielectric layer, an organic protective layer, an insulating film, an alignment film, black matrices or color filters which are made from a thermosetting resin and have an imperfection. This substrate 10 is dipped into a composition that includes TMAH and CARBITOL as indicated by the Table 3 for a desired time by way of the dipping mechanism (not depicted).

Then, the CARBITOL separates the thermosetting resin layer from the substrate 10 or the under layer film. And the TMAH separates particles of the thermosetting resin layer from each other.

At the substrate 10 stripped primarily in this manner, the thermosetting resin is partially left rather than being completely removed. In order to completely eliminate the residue of the thermosetting resin, the primarily stripped substrate 10 is fed to the physical/mechanical cleaning unit 14. The physical/mechanical cleaning unit 14 physically and mechanically cleans the primarily stripped substrate 10 by a physical and mechanical cleaning method such as brushing or supersonic wave cleaning. The physically and mechanically cleaned substrate 10 is cleaned by de-ionized water and then is conveyed for a rework process.

Figure 4:
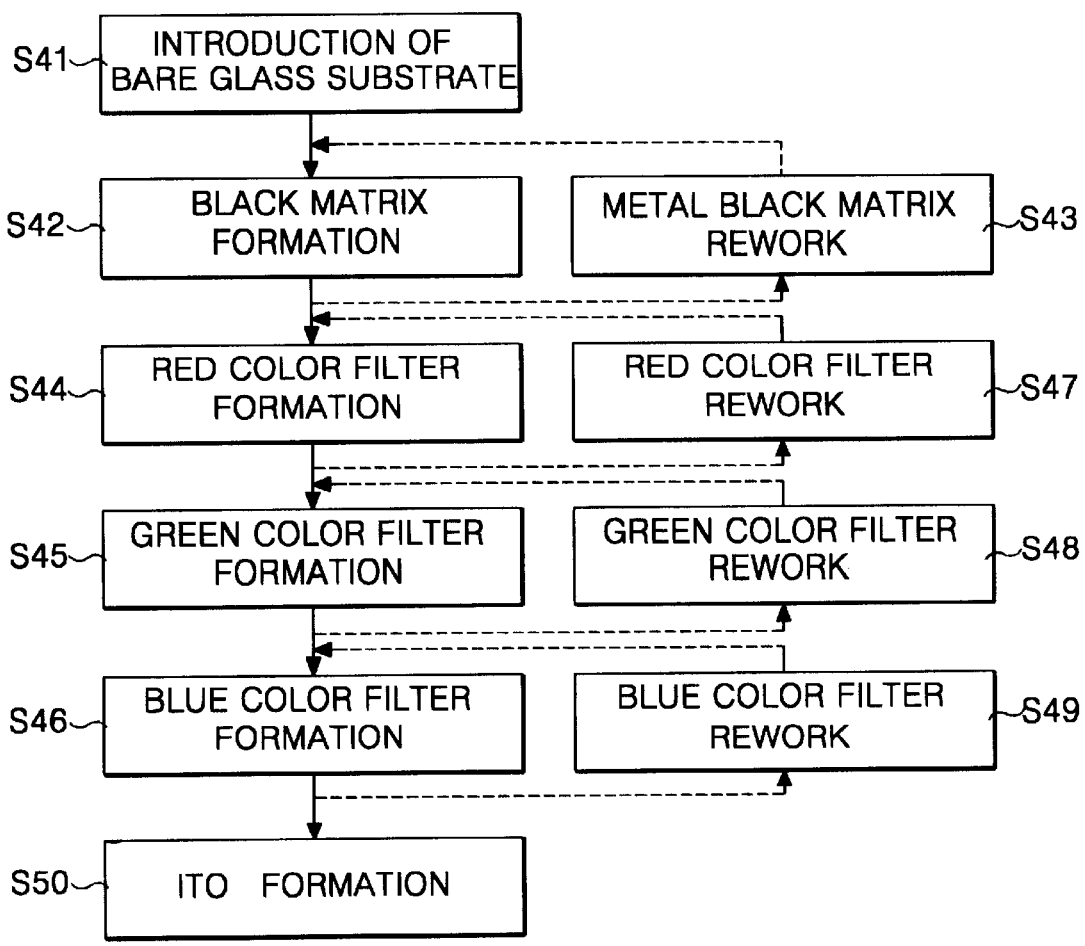
FIG. 4 is a flow chart representing a color filter rework process according to an embodiment of the present invention.

FIG. 4 is a flow chart showing a method of removing color filters and black matrices using a composition for removing a thermosetting resin according to the present invention, and which represents a rework process of a front substrate for a TN mode liquid crystal display panel.

Referring to FIG. 4, at steps S41 and S42, $Cr/CrO_X$ or $Cr/CrN_X/CrO_X$ is entirely deposited on a bare glass substrate and thereafter patterned to form metal black matrices. As a result of testing the metal black matrices formed in this manner, if it is judged that an imperfection has been generated at the metal black matrices, the metal black matrices are dipped into an etchant added with a strong acid in order to be removed. Thereafter, a process of reworking the black matrices is carried out at step S43.

After the metal black matrices are formed, polyacrylate added with red, green and blue pigments is entirely deposited on the substrate and then exposed and developed to sequentially form red, green and blue color filters at steps S44 to S46. As a result of testing the color filters, if it is judged that a problem such as a pattern imperfection of the color filters has been generated, the substrate provided with a bad color filter is loaded into the thermosetting resin eliminating apparatus as shown in FIG. 3.

The substrate loaded in the thermosetting resin eliminating apparatus is exposed to, e.g., submerged in, a composition that includes TMAH and the CARBITOL mixed at a desired component ratio and thereafter is physically and mechanically cleaned as mentioned above. As a result, if the bad color filter is completely removed, then the color filters is again formed at one of steps S47 to S49. In this case, the color filter rework process may be carried out just after each of the red, green and blue color filters is formed, or alternatively after all of the color filters are formed, depending on a time when a bad color filter has been detected. Finally, an ITO film used as a common electrode is entirely deposited on the substrate by way of sputtering equipment.

Figure 5:
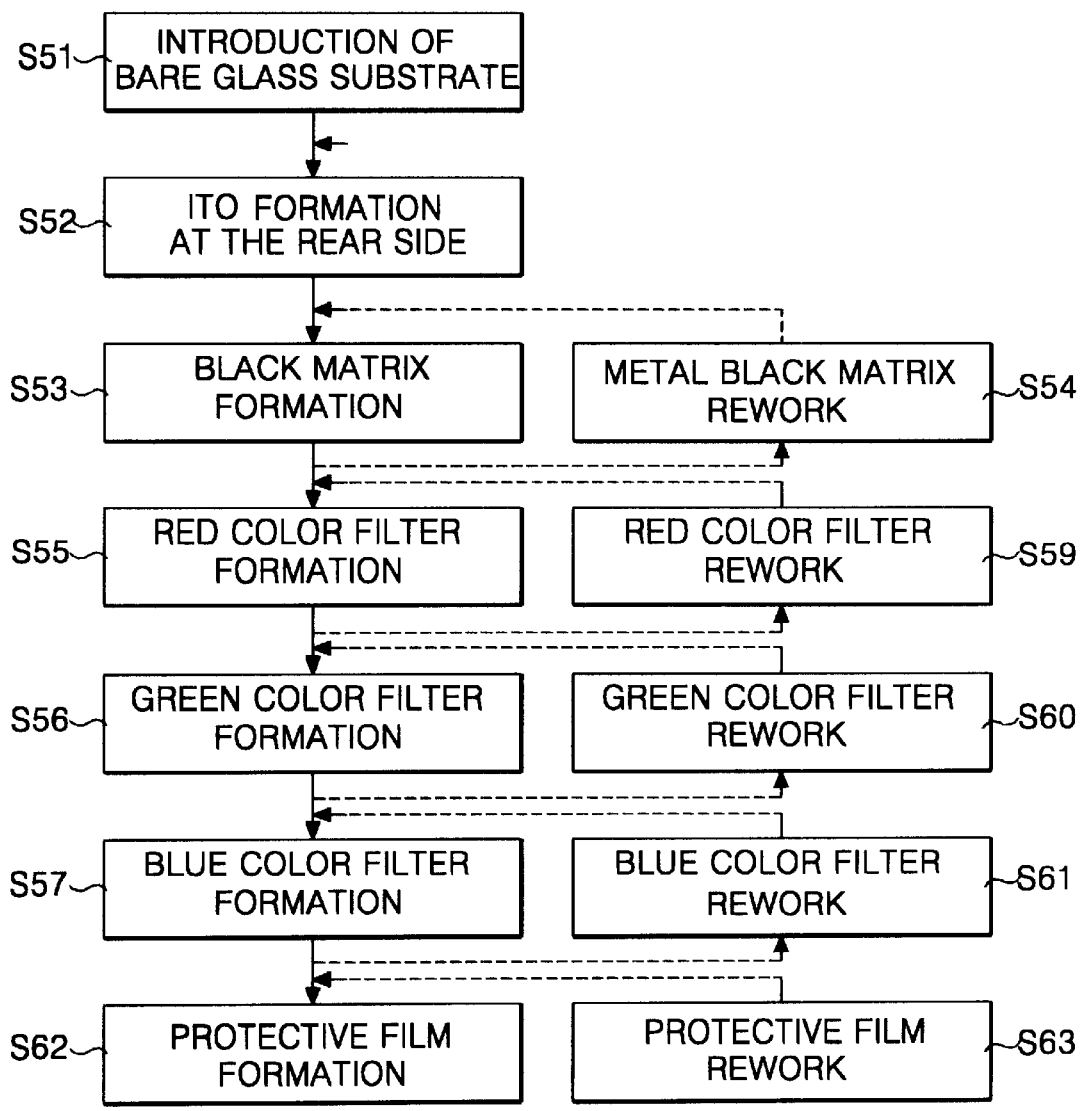
FIG. 5 is a flow chart representing a color filter rework process according to another embodiment of the present invention.

FIG. 5 is a flow chart showing a method of removing color filters and black matrices using a composition for removing a thermosetting resin according to another embodiment of the present invention, and which represents a rework process of a front substrate for an IPS mode liquid crystal display panel.

Referring to FIG. 5, at steps S51 and S52, an ITO film used as an earth (or a ground) electrode is entirely deposited on the rear side of a bare glass substrate. At step S53, resin black matrices made from polyacrylate are formed on the front side of the bare glass substrate. As a result of testing the resin black matrices formed in this manner, if it is judged that a problem has been generated with one or more the resin black matrices, the substrate is loaded in the thermosetting resin eliminating apparatus as shown in FIG. 3. After the bad resin black matrices are removed by way of the thermosetting resin eliminating apparatus, the substrate is again conveyed for a resin black matrix rework process at step S54. After the resin black matrices are formed, red, green and blue color filters made from polyacrylate are sequentially formed at steps S55 to S57.

As a result of testing the color filters, if it is judged that a problem such as a pattern imperfection in the color filters has been generated, the substrate having a bad color filter is loaded into the thermosetting resin eliminating apparatus as shown in FIG. 3. The substrate in which a bad color filter has been removed of the thermosetting resin eliminating apparatus is again conveyed for the color filter rework process at steps S59 to S61. After the color filters are formed, a protective film is entirely deposited on the substrate in such a manner to cover the color filters and the resin black matrices at step S62. Subsequently, as a result of testing the protective film, if it is judged that a problem has been generated at the protective film, the substrate is loaded into the thermosetting resin eliminating apparatus as shown in FIG. 3. Thus, the bad protective film is removed of the thermosetting resin eliminating apparatus. After the bad protective film is removed, the substrate is again conveyed for the protective film rework process.

As described above, the composition for eliminating a thermosetting resin according to the present invention is a mixture including TMAH and the CARBITOL mixed at a desired component ratio. A thermosetting resin is completely eliminated by dipping the thermosetting resin into said composition and then physically and mechanically cleaning it. Thus, the composition according to the present is suitable for removing a dielectric layer, an organic protective layer, an insulating layer, an alignment layer, black matrices and color filters, etc. made form a thermosetting resin used in an LCD or other semiconductor device, and permits a reproduction or a rework of the thermosetting resin film. As a result, it becomes possible to improve the productivity as well as to minimize the stockpile to be discarded due to a problem the thermosetting resin.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A composition for eliminating a thermosetting resinous layer or film, the compositon consisting of:

tetra methyl ammonium hydroxide (TMAH);

water; and about 50 wt % of a hygroscopic resin solvent, wherein a solution of said TMAH and said water is about 50 wt %.

2. The composition of claim 1, wherein said hygroscopic resin solvent is CARBITOL.

3. The composition of claim 2, wherein said TMAH is in a range of about 7–10 wt %.

4. The composition of claim 3, wherein said water is in a range of about 43–40 wt %, respectively, relative to said TMAH.

5. The composition of claim 4, wherein said TMAH is in a range of about 7–8 wt % and said water is in a range of about 43–42 wt %, respectively, relative to said TMAH.

6. The composition of claim 4, wherein said TMAH is about 10 wt % and said water is about 40 wt % relative to said TMAH.

7. The composition of claim 1, wherein said water is de-ionized water.

8. A method of stripping thermosetting resin from a substrate, the method comprising:

applying a stripping composition to said substrate, said stripping composition, consisting of tetra methyl ammonium hydroxide (TMAH) in a range of about 7–10 wt %, water and a hygroscopic resin solvent of about 50 wt %, wherein a solution of said TMAH and said water is 50 wt %; and cleaning, after said stripping composition has been applied, said substrate with water.

9. The method of claim 8, wherein said hygroscopic resin solvent is CARBITOL.

10. The method of claim 8, wherein said water is in a range of about 43–40 wt %, respectively, relative to said TMAH.

11. The method of claim 10, wherein said TMAH is in a range of about 7–8 wt % and said water is in a range of about 43–42 wt %, respectively, relative to said TMAH.

12. The method of claim 10, wherein said TMAH is about 10 wt % and said water is about 40 wt % relative to said TMAH.

13. The method of claim 8, wherein said water is de-ionized water.

* * * * *